United States Patent
Tani

(10) Patent No.: US 7,615,732 B2
(45) Date of Patent: Nov. 10, 2009

(54) SOLID STATE IMAGING DEVICE

(75) Inventor: Takeharu Tani, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 127 days.

(21) Appl. No.: 11/905,111

(22) Filed: Sep. 27, 2007

(65) Prior Publication Data

US 2008/0079031 A1    Apr. 3, 2008

(30) Foreign Application Priority Data

Sep. 28, 2006    (JP) .............................. 2006-265282

(51) Int. Cl.
     *H04N 5/225*    (2006.01)
(52) U.S. Cl. ...................... 250/216; 250/214.1; 348/340
(58) Field of Classification Search .............. 250/208.1, 250/216, 226; 348/340
See application file for complete search history.

(56) References Cited

U.S. PATENT DOCUMENTS 5,371,397 A * 12/1994 Maegawa et al. ........... 257/432

2004/0004668 A1 * 1/2004 Namazue et al. ........... 348/340

FOREIGN PATENT DOCUMENTS

| JP | 5-283661 A | 10/1993 |
|----|------------|---------|
| JP | 2004-221532 A | 8/2004 |

* cited by examiner

*Primary Examiner*—Georgia Y Epps
*Assistant Examiner*—Tony Ko
(74) *Attorney, Agent, or Firm*—Birch, Stewart, Kolasch & Birch, LLP

(57) ABSTRACT

Light guides are formed above each light receiving element. These light guides are made of a high refractive index material, and surrounded by a material of lower refractive index. The light guides are each made up of a light introduction region leading with a constant width from a light entrance surface, and a tapered reduced region leading from the light introduction region to a light exit surface. The light introduction region totally reflects the incident light toward the reduced region. The reduced region, owing to its tapered shape, surely directs the light onto a light receiving element, and prevents the light from entering charge transfer paths around the light receiving element.

9 Claims, 5 Drawing Sheets

SOLID STATE IMAGING DEVICE

FIELD OF THE INVENTION

The present invention relates to a solid state imaging device with light guides to direct light onto light receiving elements.

BACKGROUND OF THE INVENTION

Solid state imaging devices, such as charge coupled device (CCD) image sensors and complementary metal oxide semiconductor (CMOS) image sensors, have been used as a solid state imaging device in digital cameras. Usually containing millions of light receiving elements (for example, photodiodes) which correspond to each pixel of a single chip and convert light into a signal charge, the solid state imaging devices output an image signal representative of an optical image formed by a lens system. To capture high definition images, the solid state imaging devices are becoming to have more pixels in these days. When more pixels are incorporated in the digital camera, each light receiving element necessarily becomes smaller, and the sensitivity of the digital camera decreases. Therefore, micro-lenses are commonly introduced in front of the light receiving elements so as to enhance the focusing efficiency.

Some of the solid state imaging devices are equipped with light guides which direct incident light to the light receiving elements. The light guides are each disposed between the micro-lens and the light receiving element, and increase an amount of the light incident on the light receiving elements by reflecting the light toward the light receiving elements (see, for example, Japanese Patent Laid-open Publications No. 05-283661 and No. 2004-221532). The light guide of the publication No. 05-283661 is constituted of a light transmission film formed inside an opening of an insulating film and a reflecting surface over the opening. The light guide of the publication No. 2004-221532 is made of silicon nitride having a higher refractive index than a surrounding translucent medium, and guides the incident light to the light receiving element by total reflection.

These prior art light guides have a tapered shape with a large light entrance surface and a small light exit surface at both ends, so that they can take in the light from a wide area. Additionally, this small light exit surface serves to prevent the light out of the light guide from going to the transfer CCDs adjoining the light receiving element. This leads to prevent the image smear or such noises, which will otherwise be induced by the light spreading to enter the transfer CCDs.

When the tapered shape is incorporated, however, some drawbacks arise in the prior art light guides. For example, in the light guide of the publication No. 05-283661, the reflective surface slopes, and may reflect a part of the incident light toward the light entrance surface. In the light guide of the publication No. 2004-221532, a ray of light may occasionally strike a side surface of the light guide at an angle smaller than the critical angle, and passes through it. In other words, with the tapered shape, the prior art light guides would not direct the incident light to the light receiving elements efficiently.

SUMMARY OF THE INVENTION

In view of the foregoing, an object of the present invention is to provide a solid state imaging device with light guides which direct light to light receiving elements efficiently.

In order to achieve the above and other objects, the solid state imaging device according to the present invention includes light guides, located above each light receiving element, to guide incident light onto the light receiving elements. Each light guide is made up of a light introduction region leading with a constant width from a light entrance surface, and a reduced region leading from the light introduction region to a light exit surface and having a smaller width than the light introduction region.

It is preferred that the reduced region has a cross section gradually tapered toward the light receiving element. Alternatively, the reduced region may have a constant width.

Additionally, the light guides are preferably made of a material of a higher refractive index than the surrounding components, and reflect the incident light totally toward the light receiving elements. The high refractive index material preferably is silicon nitride. In this case, the light introduction region preferably has a side surface which is parallel to a normal of a light receiving surface of the light receiving element.

It is also preferred that the reduced region has a height not greater than a wavelength of the incident light, and that a difference in width between the light exit surface and the light introduction region is not less than 10 nm and not greater than the wavelength of the incident light.

In a preferred embodiment of the present invention, the solid state imaging device includes transfer paths on which the signal charge is transferred, and a light shielding film which has openings above the light receiving elements and covers the transfer paths. The light shielding film includes skirt parts which gradually extend at a vicinity of the light receiving element into each of the opening. These skirt parts and the openings are reflective on the surface, and give a cylindrical shape to the light guides. It is also preferred to make the light shielding film from aluminum.

According to the present invention, the light introduction region allows light from a wide area to enter the light guide, and directs the light to the light receiving element efficiently. Additionally, the reduced region that has a smaller width than the light introduction region prevents the light from entering the charge transfer paths around the light receiving element, and reduces the occurrence of noises.

BRIEF DESCRIPTION OF THE DRAWINGS

The above objects and advantages of the present invention will become more apparent from the following detailed description when read in connection with the accompanying drawings, in which.

DETAILED DESCRIPTION OF THE PREFERRED EMBODIMENTS

Figure 1:
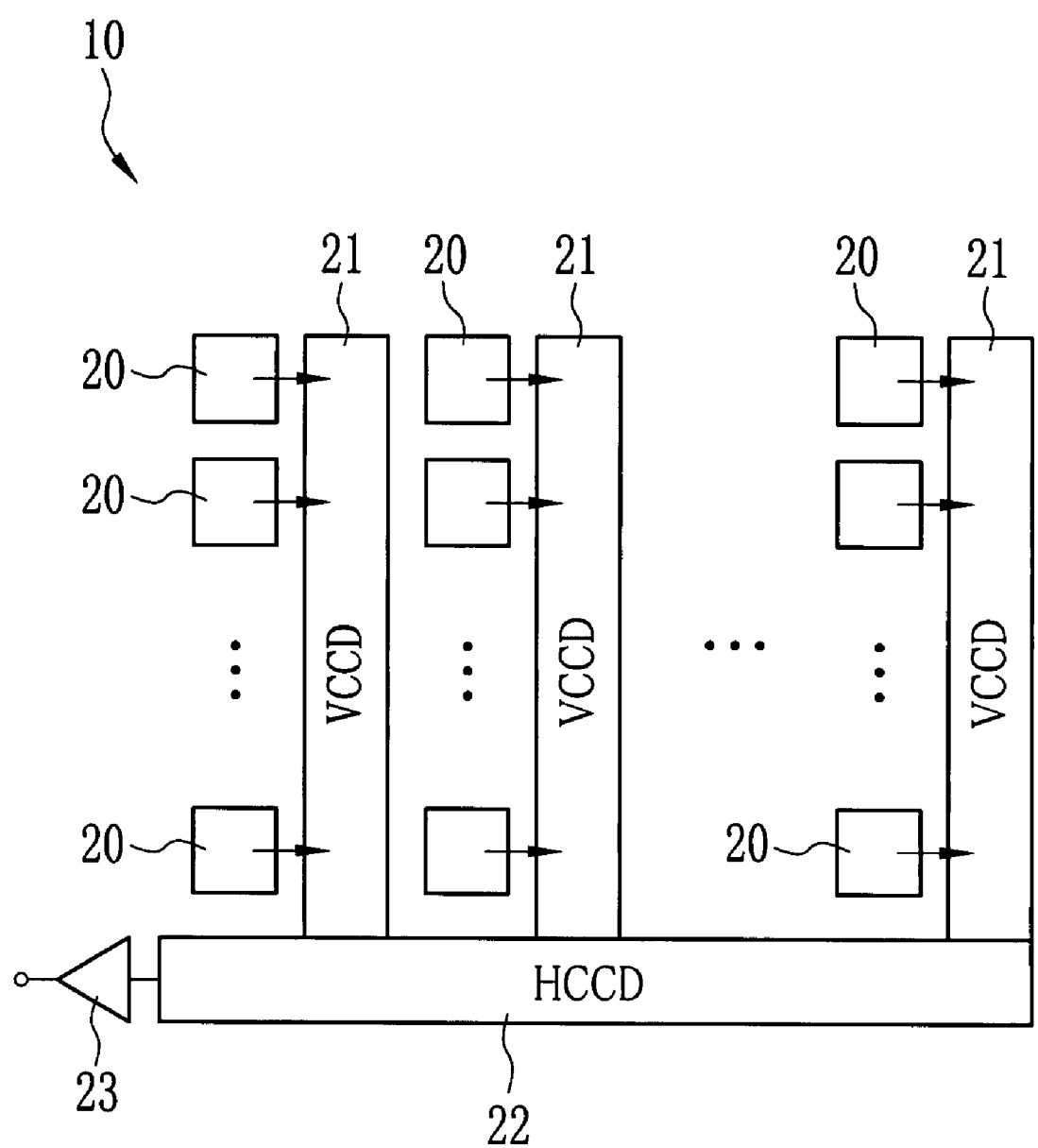
FIG. 1 is a plan view schematically illustrating a CCD image sensor according to the present invention.

Referring to FIG. 1, a CCD image sensor 10 has a plurality of light receiving elements (photodiodes) 20 arranged in a two dimensional matrix form. The light receiving elements 20 convert light into an electrical signal equivalent to an amount of the light, and store this signal charge. The CCD image sensor 10 also has vertical transfer CCDs (VCCDs) 21 and a horizontal transfer CCD (HCCD) 22 which, in combination, transfer the signal charges of the light receiving elements 20 using an interline transfer method. The vertical transfer CCDs 21 extend along each column of the light receiving elements 20. The horizontal transfer CCD 22 is connected to the terminal ends of all the vertical transfer CCDs 21.

The signal charge in every light receiving element 20 is read out, all at once, into the vertical transfer CCDs 21 through transfer gates (not shown) in a predetermined readout cycle. The vertical transfer CCDs 21 transfer these signal charges, a step at a time, to the horizontal transfer CCD 22. The horizontal transfer CCD 22 transfers a row of the signal charges, transferred from the terminal ends of the vertical transfer CCDs 21, to an output amplifier 23. The output amplifier 23 converts the signal charges into a voltage signal equivalent to the charge amount, and outputs this voltage signal as an image signal.

Figure 2:
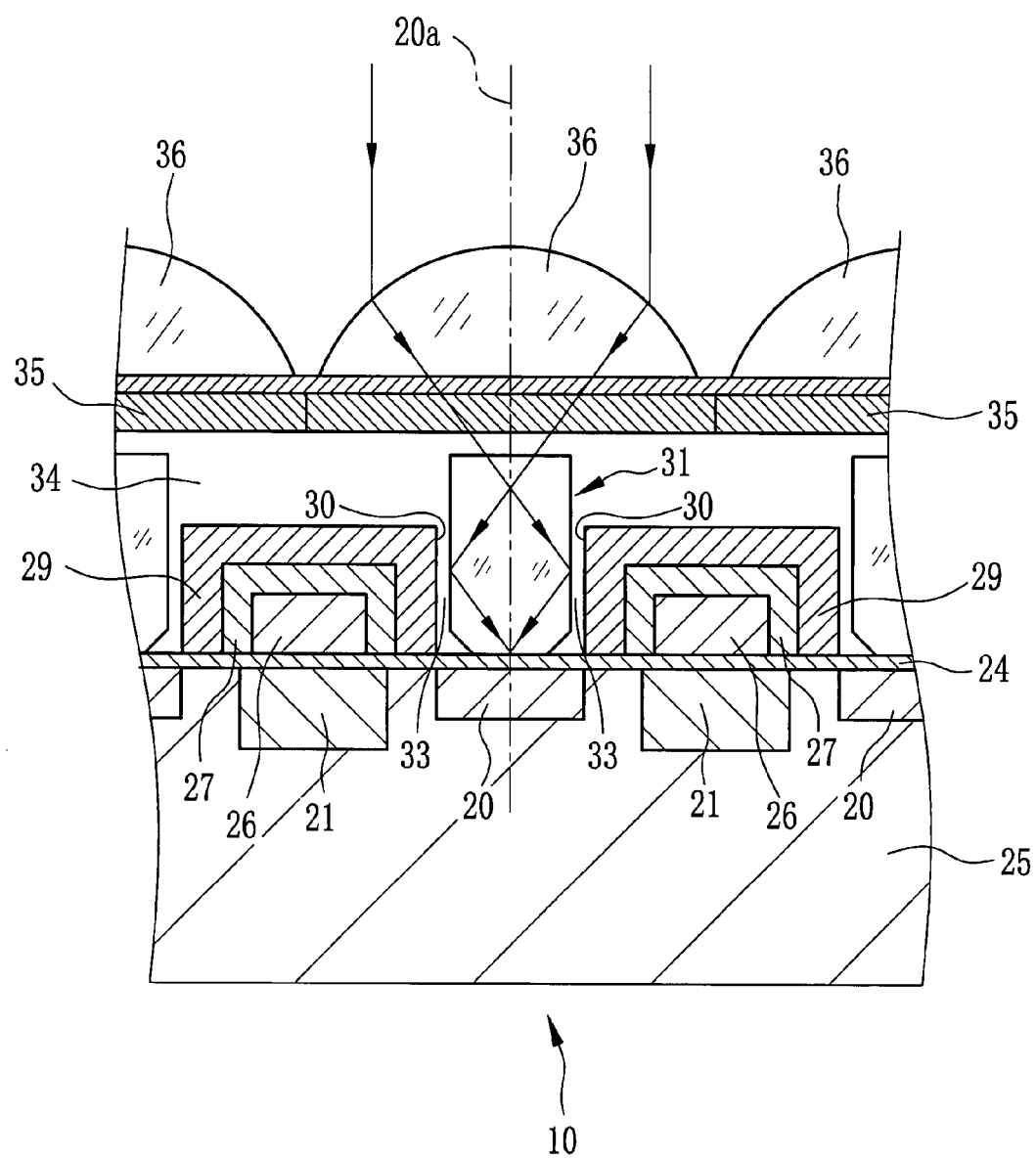
FIG. 2 is a cross section view of the CCD image sensor.

As shown in FIG. 2, the light receiving elements 20 and the vertical transfer CCDs 21 are formed in a semiconductor substrate 25, and transfer electrodes 26 are formed above each vertical transfer CCD 21. The transfer electrodes 26 are covered, on their upper and side surfaces, with an insulating film 27 made of silicon dioxide ($SiO_2$), and this insulating film 27 is covered with a light shielding film 29. Made of a lightproof material, such as tungsten or aluminum, the light shielding film 29 protects the vertical transfer CCDs 21 from light. Additionally, the light shielding film 29 has a plurality of openings 30 above each light receiving element 20. In the drawing, a reference numeral 24 is a transparent insulating layer ($SiO_2$).

Inside the each opening 30, a light guide 31 is provided. The light guide 30 is made of a high refractive index material, and surrounded by a low refractive index layer 33. The high refractive index material is, for example, silicon nitride, and the low refractive index layer 33 is made of, for example, BPSG (Boron Phosphorous Silicate Glass), the same material as a planarizing layer 34 which covers the light shielding film 29. The light guides are formed into a square or polygonal pole that corresponds to the shape of the light receiving elements 20.

Lying superior to the openings 30 are color filters 35 in red, green, blue, or a specific color. Above the color filters 35, convex micro-lenses 36 to focus light toward the light receiving elements 20 are provided. It is to be noted that the centers of the light receiving element 20, the light guide 31, and the micro-lens 36 are collinear on an imaginary straight line, or a normal 20a of the light receiving element 20.

The light guide 31 of high refractive index material functions as a core, and the surrounding low refractive index layer 33 functions as a clad. Light that enters the light guide 31 from the micro-lens 36 is totally reflected at the boundary to the low refractive index layer 33, and reaches the light receiving element 20. Accordingly, the sensitivity of the light receiving element 20 is increased.

Figure 3:
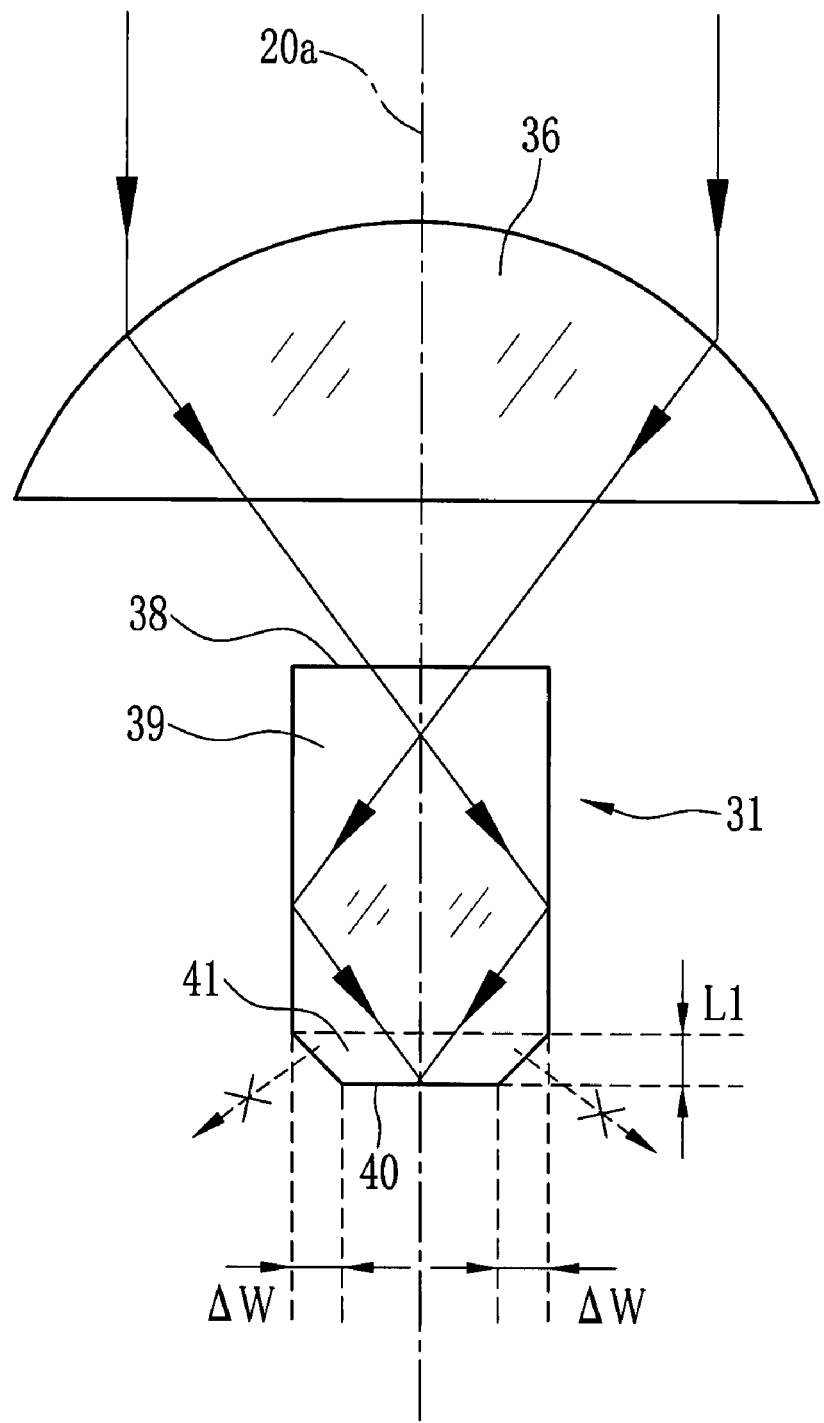
FIG. 3 is a cross section view showing an operation of a light guide according to the present invention.

As shown in FIG. 3, the light guide is made up of two regions, a light introduction region 39 leading from a light entrance surface 38 on the side to the micro-lens 36, and a reduced region 41 leading from the light introduction region 39 to a light exit surface 40 on the side to the light receiving element 20. The light introduction region 39 has a constant cross section shape with the same width as the light entrance surface 38, or in other words, a cylindrical shape with a fixed width. Additionally, an outer surface (the boundary surface to the low refractive index layer 33) of the light introduction region 39 are parallel to the normal 20a.

The reduced region 41, formed integral with the light introduction region 39, has a cross section tapered toward the light exit surface 40. Namely, the light guide 31 resembles a cylinder with a chamfered bottom edge. To form the light guide 31, the BPSG is firstly spread over the light receiving elements 20 and the light shielding film 29, so that the low refractive index layer 33 and the planarizing layer 34 are formed. Then, a vertical hole is made on each light receiving element 20 by a dry etching process, and this vertical hole is filled with silicon nitride, i.e. the high refractive index material 32.

More particularly, the dry etching process is stopped before the vertical hole goes all the way through the BPSG, in other words, when the hole just for the light introduction region 39 is created. The dry etching process is then restarted to pierce the BPSG all the way while the size of the hole is gradually reduced. Finally, the silicon nitride is put into this through hole by a plasma CVD process or the like process. In this manner, the cylindrical light introduction region 39 and the tapered reduced region 41 are formed.

It is preferred that the reduced region 41 has a height L1 not greater than a wavelength of the light incident on the light receiving element 20. Also, it is preferred that a width difference $\Delta W$ between the light introduction region 39 and the light exit surface 40 is not less than 10 nm and not greater than the wavelength of the light. This configuration prevents the tapered reduced region 41 from reflecting the light on its internal side surface toward the micro-lens 36. This configuration also prevents a part of the incident light from passing through the side surface of the reduced region 41 as an evanescent light. The evanescent light, if passing through, will penetrate the low refractive index layer 33 to the vertical transfer CCD 21, and results in the noise. As for the width difference, meanwhile, a desirable $\Delta W$ for the reduced region 41 of such tapered shape as this embodiment is substantially equal to the wavelength of the incident light on the corresponding light receiving element 20.

Next, the operation of the CCD image sensor 10 with the light guides 31 is described. Light that enters the CCD image sensor 10 is focused by the micro-lens 36 onto the light entrance surface 38 of the light guide 31. At this point, the light incident on the light entrance surface 38 is either parallel or oblique to the normal 20a.

Of the oblique incident light, one at a small angle to the normal 20a will go straight through the light guide 31 to the light receiving element 20. On the other hand, one at a deep angle to the normal 20a will strike the side surface of the light introduction region 39 at an angle larger than the critical angle because the side surface of the light introduction region 39 is parallel to the normal 20a. Accordingly, this incident light is not refracted into the low refractive index layer 33 but totally reflected toward the reduced region 41.

Then, the light proceeds in the reduced region 41 and exits from the light exit surface 40 to the light receiving element 20. Since the reduced region 41 is narrower than the light introduction region 39, the light does not scatter outward but is rather oriented inwards (toward the light receiving element 20), and the entrance of the light into the vertical transfer CCDs 21 is prevented.

Figure 4:
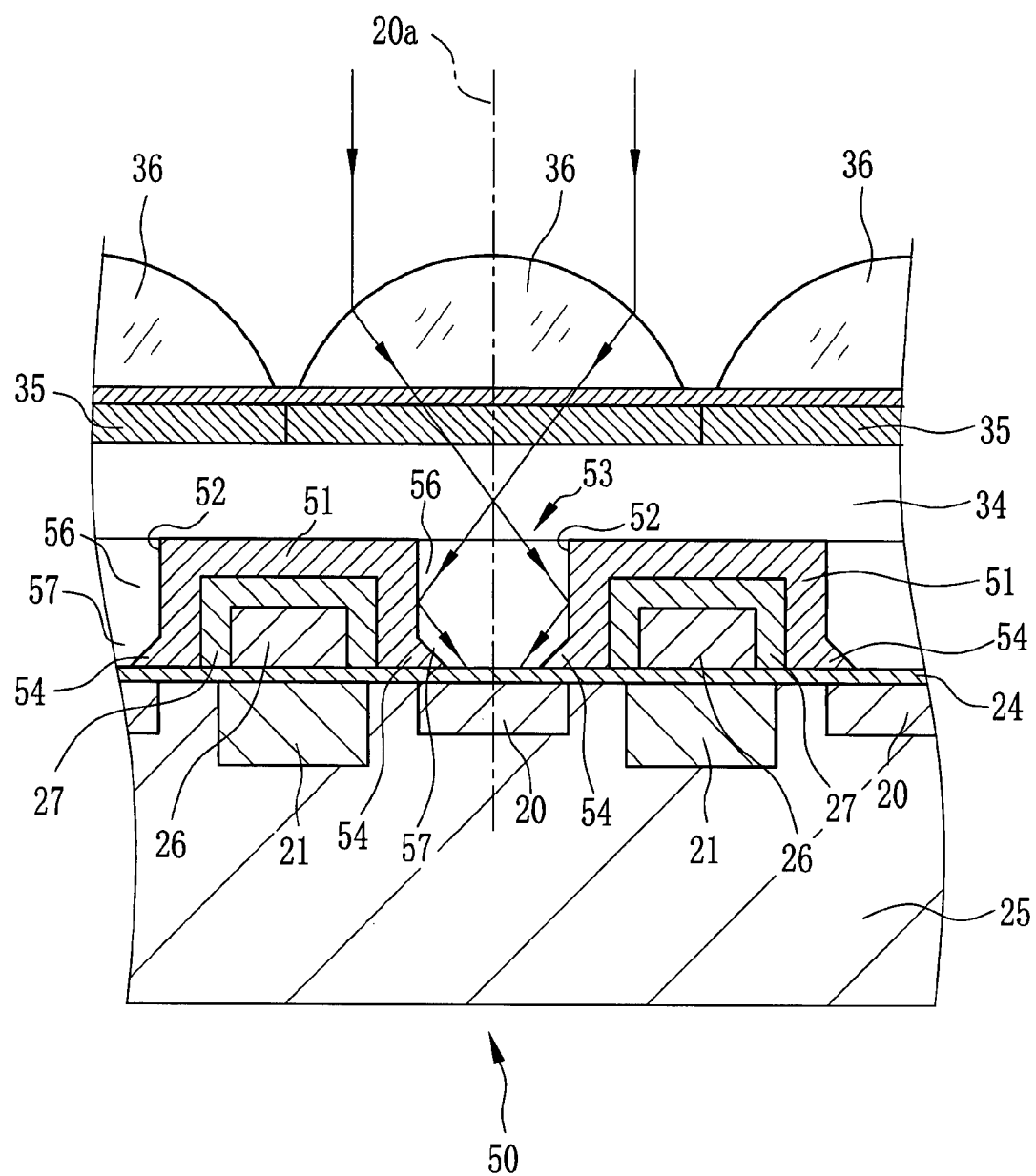
FIG. 4 is a cross section view illustrating a second embodiment of the present invention.

Hereinafter, a second embodiment of the present invention is described. As shown in FIG. 4, a CCD image sensor 50 has a light shielding film 51 which covers the transfer electrodes 26 and the insulating film 27. The light shielding film 51 includes a plurality of openings 52 above the light receiving elements 20, and these openings 51 are filled with a transparent insulating material, such as silicon dioxide. Additionally, the light shielding film 51 is made of a high reflectance material, such as aluminum, and an inner surface of each opening gives a cylindrical form to a light guide 53 which reflects and directs light onto the light receiving element 20.

The light shielding film 51 also has skirt parts 54 which gradually extend, at around the boundary to the semiconductor substrate 25, into each of the openings 52. These skirt parts 54 together with light shielding film 51 shapes, at inside each opening 52, a cylindrical light introduction region 56 with a constant width and a tapered reduced region 57 with a smaller width than the light introduction region 56.

The light introduction region 56 efficiently takes in the light from the micro-lens 36. The reduced region 57 prevents the light from going to the outside of the light receiving element 20, reducing the occurrence of the noise in the vertical transfer CCDs 21.

Figure 5:
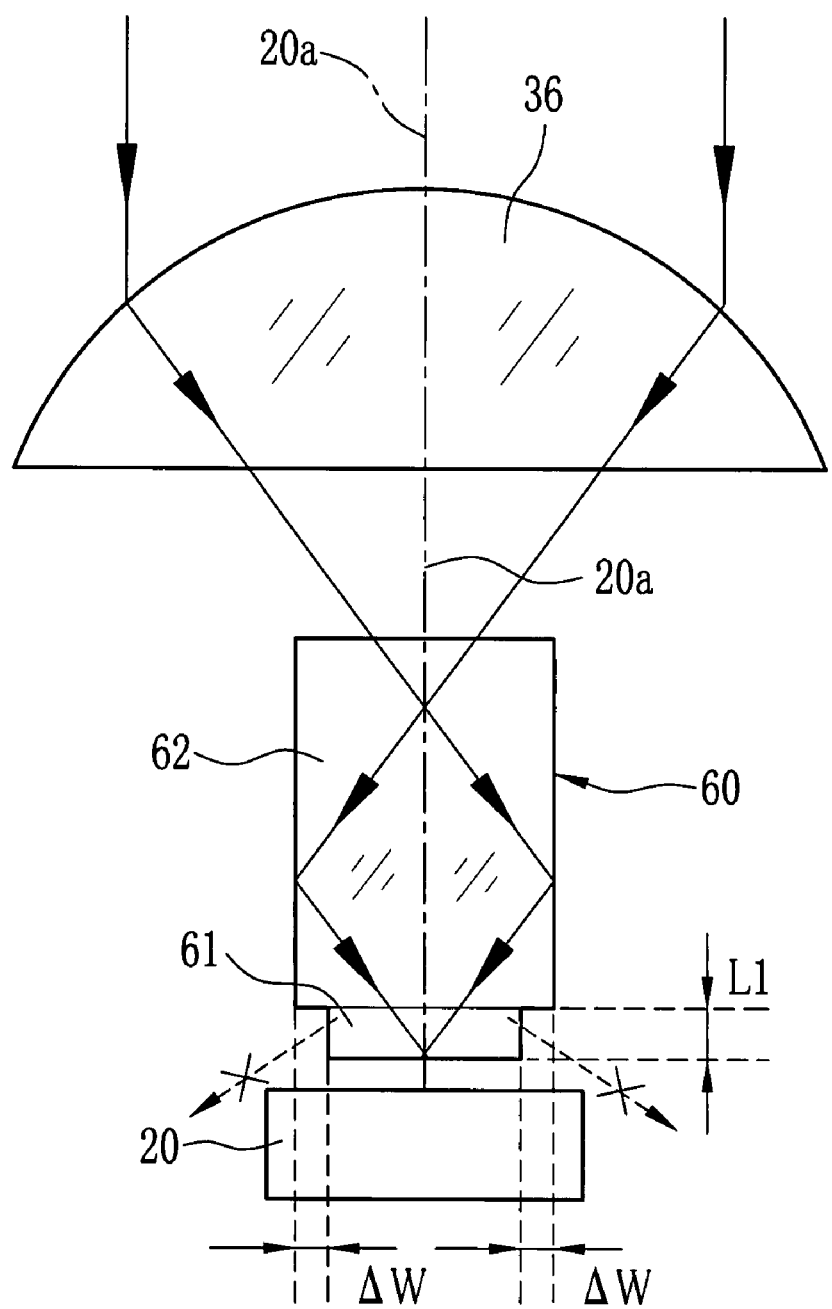
FIG. 5 is a cross section view illustrating a third embodiment of the present invention

While the above embodiments show the reduced region of tapered shape, the reduced region may take a cylindrical shape such as a reduced region 61 of a light guide 60 in FIG. 5. This reduced region 61 is narrower than a light introduction region 62, and the side surface thereof is parallel to the normal 20a. The reduced region 61 has the height L1 not greater than a wavelength of the light incident on the light receiving element 20, and the width difference $\Delta W$ between the reduced region 61 and the light introduction region 62 is not less than 10 nm and not greater than the wavelength of the light.

If the micro-lenses 36 do not achieve a high level of focusing efficiency, additional lenses may be provided between the micro-lenses and the light guides. Furthermore, the present invention is applicable not only to the CCD image sensors but to the CMOS image sensors.

Although the present invention has been fully described by the way of the preferred embodiments thereof with reference to the accompanying drawings, various changes and modifications will be apparent to those having skill in this field. Therefore, unless otherwise these changes and modifications depart from the scope of the present invention, they should be construed as included therein.

What is claimed is:

1. A solid state imaging device including a plurality of light receiving elements to convert light into a signal charge, comprising:
   light guides located above each said light receiving element, each of said light guides directing incident light on a light entrance surface thereof to a light exit surface thereof toward a corresponding said light receiving element, said light guide being made up of a light introduction region leading with a constant width from said light entrance surface and a reduced region leading from said light introduction region to said light exit surface with a smaller width than said light introduction region,
   wherein a length between said light exit surface and an interface between said light introduction region and said reduced region has a height not greater than a wavelength of said incident light, and a difference in width between said light exit surface and said light introduction region is not less than 10 nm and not greater than said wavelength of said incident light.

2. The solid state imaging device of claim 1, wherein said reduced region has a cross section whose width is gradually narrowed toward said light receiving element.

3. The solid state imaging device of claim 1, wherein said reduced region has a constant width.

4. The solid state imaging device of claim 1, wherein said light guide is made of a high refractive index material and surrounded by a material of low refractive index, so as to totally reflect said incident light toward said light receiving element.

5. The solid state imaging device of claim 4, wherein said high refractive index material is silicon nitride.

6. The solid state imaging device of claim 4, wherein said light introduction region has a side surface which is parallel to a normal of a light receiving surface of said light receiving element.

7. The solid state imaging device of claim 1, further comprising transfer paths on which said signal charge is transferred, and a light shielding film with openings above said light receiving elements and for covering said transfer paths.

8. The solid state imaging device of claim 7, wherein said light shielding film includes skirt parts each of which gradually extends at a vicinity of said light receiving element into each said opening, and wherein said skirt parts and said openings are reflective on the surface and give a cylindrical form to said light guides.

9. The solid state imaging device of claim 8, wherein said light shielding film is made of aluminum.

\* \* \* \* \*